United States Patent
Dwyer et al.

(10) Patent No.: US 11,958,739 B2
(45) Date of Patent: Apr. 16, 2024

(54) METHOD FOR ABLATING OR ROUGHENING WAFER SURFACES

(71) Applicant: University of Rhode Island Board of Trustees, Kingston, RI (US)

(72) Inventors: Jason Rodger Dwyer, Providence, RI (US); Y. M. Nuwan D. Y. Bandara, Gonawala (LK); Brian Sheetz, Saunderstown, RI (US)

(73) Assignee: University of Rhode Island Board of Trustees, Kingston, RI (US)

( * ) Notice: Subject to any disclaimer, the term of this patent is extended or adjusted under 35 U.S.C. 154(b) by 451 days.

(21) Appl. No.: 17/188,985

(22) Filed: Mar. 1, 2021

(65) Prior Publication Data

US 2021/0269304 A1    Sep. 2, 2021

Related U.S. Application Data

(60) Provisional application No. 62/983,326, filed on Feb. 28, 2020.

(51) Int. Cl.
*B81C 1/00* (2006.01)

(52) U.S. Cl.
CPC ...... *B81C 1/00547* (2013.01); *B81C 1/00071* (2013.01); *B81C 2201/0133* (2013.01); *B81C 2201/0145* (2013.01)

(58) Field of Classification Search
CPC ........ B81C 1/00071; B81C 2201/0133; B81C 2201/0145; B81C 1/00547; G01N 21/658; H01L 21/3086; H01L 21/3105
See application file for complete search history.

(56) References Cited

U.S. PATENT DOCUMENTS

2008/0257867 A1* 10/2008 Malshe ............... B81C 1/00492
                                                  219/69.14
2019/0221402 A1*  7/2019 Glukhoy ............. H01J 37/3288

OTHER PUBLICATIONS

Sheetz et al., "Rapid, General-Purpose Patterning of Silicon Nitride Thin Films Under Ambient Conditions . . . ", ACS Appl. Nano Mater. 2020, 3, 2969-2977 (Year: 2020).*
Nuwan et al., "Push-Button Method to Create Nanopores Using a Tesla-Coil Lighter", ACS Omega 2019, 4, pp. 226-229 (Year: 2019).*

* cited by examiner

*Primary Examiner* — Shahed Ahmed
*Assistant Examiner* — Sun Mi Kim King
(74) *Attorney, Agent, or Firm* — Milstein Zhang & Wu LLC Duan Wu, Esq.

(57) ABSTRACT

The present invention provides a simple method for ablating a protective thin film on a bulk surface and roughening the underlying bulk. In an embodiment, silicon nitride thin films, which are useful as etch-stop masks in micro- and nano-fabrication, is removed from a silicon wafer's surface using a hand-held "flameless" Tesla-coil lighter. Vias created by a spatially localized electron beam from the lighter allow a practitioner to perform micro- and nano-fabrication without the conventional steps of needing a photoresist and photolithography. Patterning could be achieved with a hard mask or rastering of the spatially confined discharge, offering—with low barriers to rapid use—particular capabilities that might otherwise be out of reach to researchers without access to conventional, instrumentation-intensive micro- and nano-fabrication workflows.

23 Claims, 9 Drawing Sheets

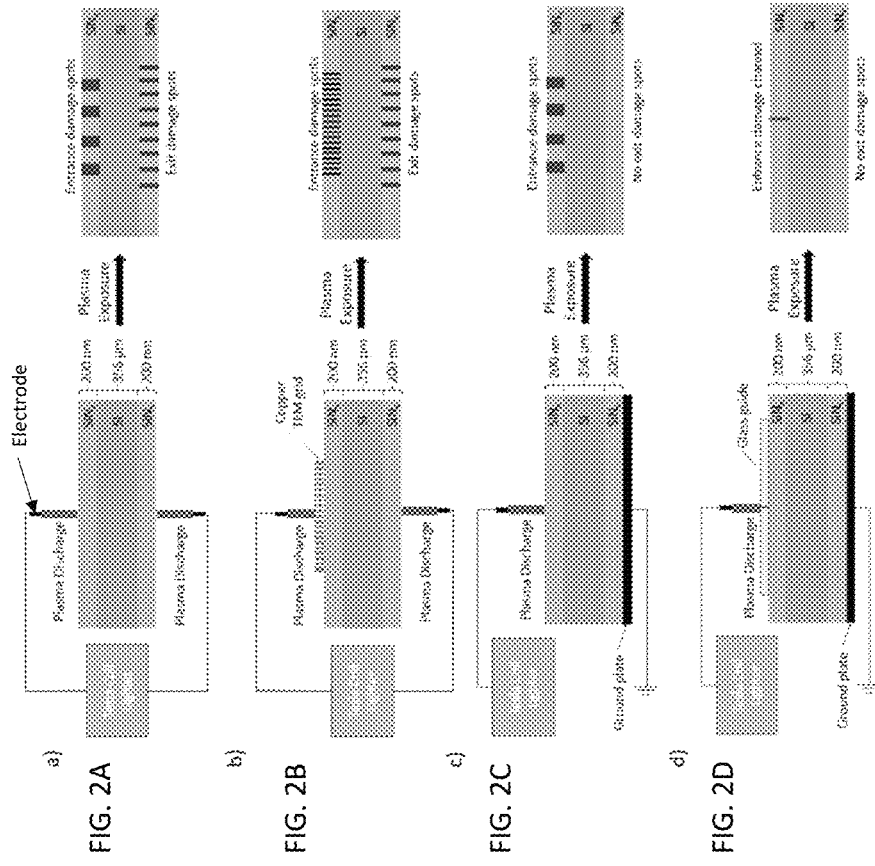

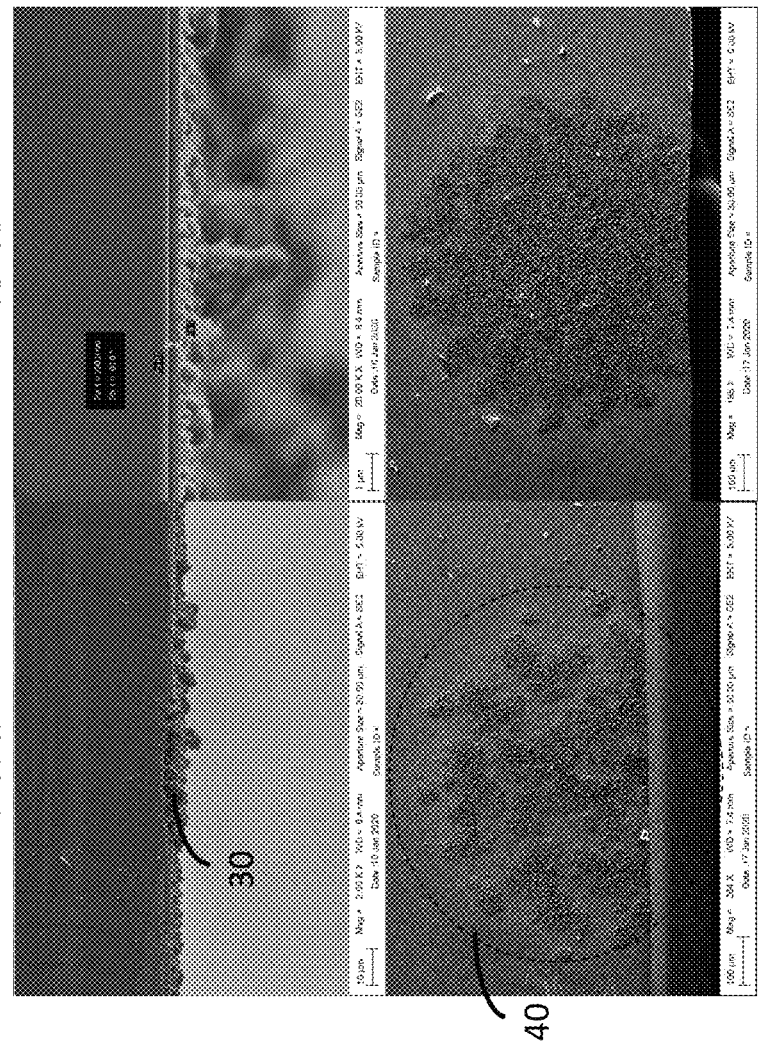
FIG. 6A  FIG. 6B
FIG. 6C  FIG. 6D
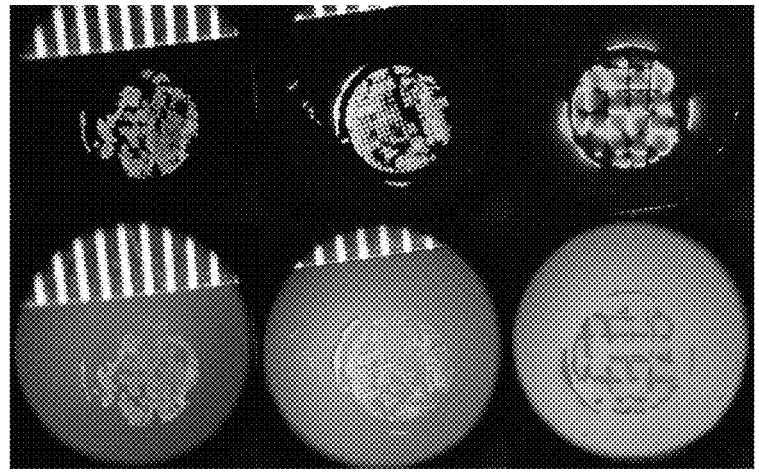
FIG. 7

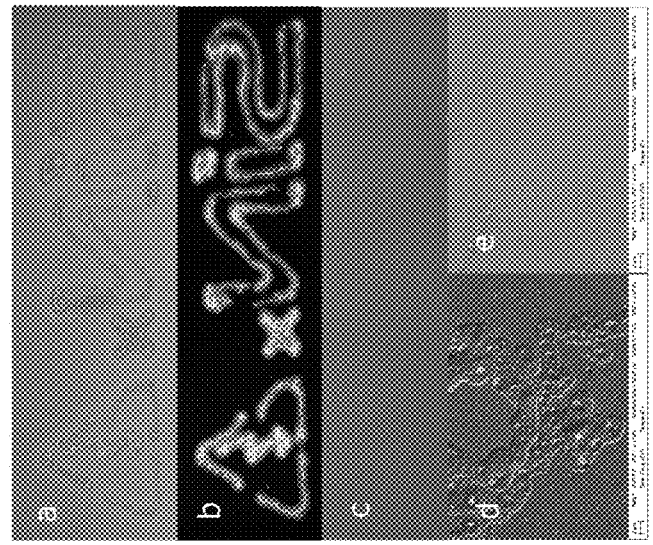
FIG. 9A
FIG. 9B
FIG. 9C
FIG. 9D
FIG. 9E
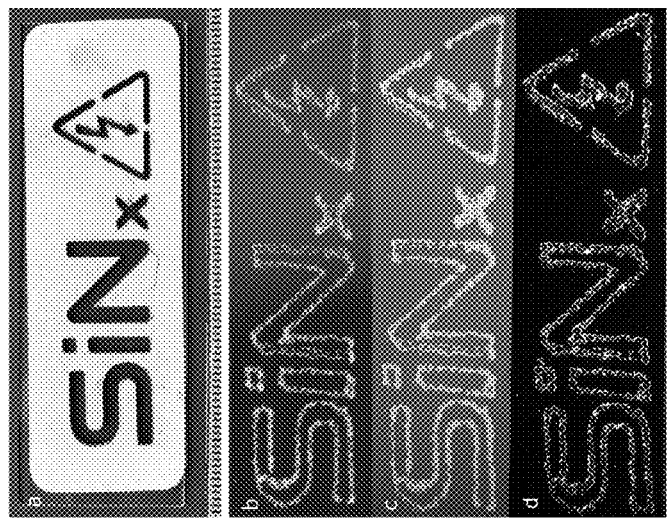
FIG. 8A
FIG. 8B
FIG. 8C
FIG. 8D

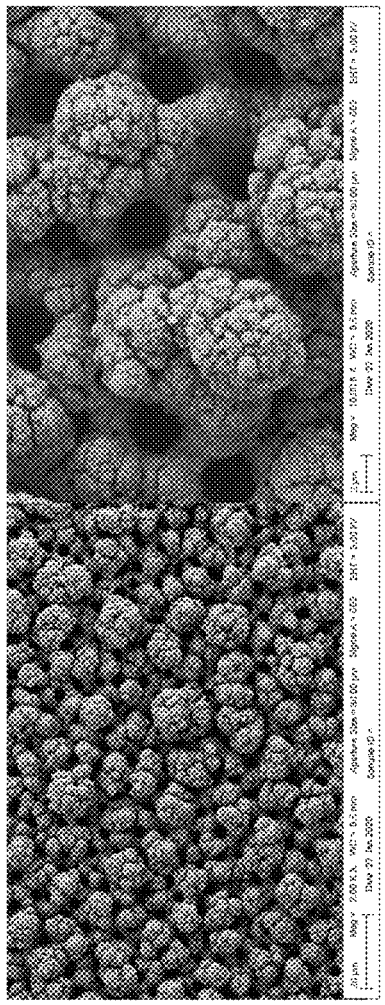
FIG. 11A
FIG. 11B
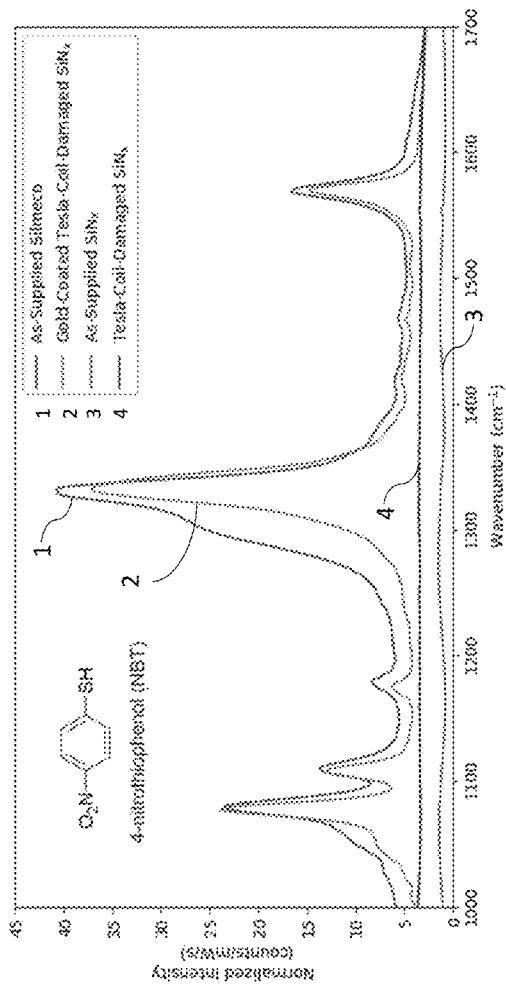
FIG. 12

METHOD FOR ABLATING OR ROUGHENING WAFER SURFACES

CROSS-REFERENCE TO RELATED APPLICATIONS

This application claims priority to and the benefit of U.S. provisional patent application Ser. No. 62/983,326, filed Feb. 28, 2020, which application is incorporated herein by reference in its entirety.

STATEMENT REGARDING FEDERALLY SPONSORED RESEARCH OR DEVELOPMENT

This invention was made with government support under CBET1150085, 1808344 and 1330406 awarded by the National Science Foundation. The government has certain rights in the invention.

FIELD OF THE INVENTION

The present invention relates to surface processing or microfabrication in general and particularly to a method of ablating, roughening or removal of materials from a substrate surface, such as a wafer optionally coated with a thin film using electron beams. The present invention provides rapid, general-purpose patterning of a wafer substrate for applications including but not limited to the fabrication of microfluidic channels and substrate for Surface-Enhanced Raman Spectroscopy (SERS) and other optical-based sensing technologies.

BACKGROUND OF THE INVENTION

Thin-film silicon-rich silicon nitride films ($SiN_x$ or $Si_xN_y$) have become ubiquitous in consumer electronics and in platforms across science and engineering. These thin films serve a wide range of functions in micro- and nanofabricated processes and products, and in their applications, including as simple structural building blocks; as barriers serving as electrical insulation, sample supports and sample chamber windows, diffusion barriers, chemical etch stops, and surface passivation layers; and as the foundation for more sophisticated (nano)structures.

$SiN_x$-coated Si wafers can be purchased commercially so end users need neither access to the specialized infrastructure of nanofabrication nor operational expertise. However, free-standing ~100 nm-thick $SiN_x$ "windows" on Si frames, which are slightly more complicated structures, are available commercially only after a tightly controlled series of photolithographic, reactive ion etching (RIE), and wet chemical etching steps in highly controlled environments of clean rooms with suitable equipment. Such windows have a host of applications including: as sample supports that provide effective transparency to charged particles and photons across a range of energies; as windows to interface instrumentation operating in vacuum to samples in ambient or liquid environments; as supports for nanopore single-molecule sensors for genomics, proteomics, and glycomics applications; and as housings for nanoapertures for filtration and controlled sample introduction and formation. See, e.g., Dwyer, J. R., et al., "Silicon Nitride Thin Films for Nanofluidic Device Fabrication," Nanofluidics 2016, 2nd ed. Chapter 7. Without access to a vendor or to suitable nanofabrication facilities and equipment, even such a simple, yet powerful, structural modification of a $SiN_x$-coated Si wafer would be essentially out of reach for most researchers, scientists and manufacturers. The very benefits of $SiN_x$ thin films for applications listed above—their mechanical, electrical, and chemical robustness—can prove quite burdensome when it comes to modifying their structure.

The use of a lithographically- and RIE-patterned $SiN_x$ thin film as a hard mask for subsequent processing, as in the fabrication of the free-standing windows described above, is an important approach in Si micro- and nanofabrication more generally. In a conventional embodiment, a $SiN_x$ thin film is deposited onto each side of the Si wafer: one of the films is sacrificed to be patterned as a hard mask to spatially control a wet etching process, and the other film is protected so that it remains intact across the opening created by removal of Si.

A conventional fabrication flow, carried out in a cleanroom housing the necessary instrumentation, involves (1) spin-coating a thin film of (polymer) photoresist onto both $SiN_x$ films; (2) photo-irradiating one photoresist layer through a mask to transfer the mask pattern to that photoresist layer; (3) selectively dissolving away either parts of the photoresist that had been exposed to light (or those that had been shielded from light exposure by the mask); (4) transferring the piece to a vacuum chamber where reactive gases then etch away (via RIE) the now-exposed areas of $SiN_x$, (5) leaving the protective photoresist layer intact and the still fully photoresist-coated $SiN_x$ layer untouched; (6) removing the remaining photoresist layers; and (7) finally subjecting the Si exposed through openings in the now-patterned $SiN_x$ layer to whatever material processing steps where the end goal of this work flow—etching by immersion in a hot KOH bath for the formation of free-standing $SiN_x$ windows.

In this example, one $SiN_x$ film coating the silicon wafer is sacrificed to use as a mask, and the other film is left intact to serve as the window over a micron to millimeter-length scale opening. Importantly, all of this intensive materials processing does not necessarily yield a single nanoscale feature: it simply relies on the existing nanoscale thickness of the $SiN_x$ film. In other words, all of the nanoscale fabrication was done only during the $SiN_x$ thin film deposition stage.

Given the complexity, duration, and equipment necessary to arrive at just this single processing step (spatially localized KOH etching), there has been a great need for a new method that would permit structural modifications of as-supplied $SiN_x$ thin films quickly and without costly, specialized facilities. Such a capability would allow the patterning of $SiN_x$ thin films as a stand-alone goal, as well as the patterning of $SiN_x$ thin films to serve as masks for further processing of an underlying substrate. Existing solutions include mechanical options such as the use of a diamond scribe, which could work for supported films, but our solution provides a non-contact option to allow for modification of free-standing $SiN_x$ films. Moreover, an alternative to mechanical damage by scribing might also allow for more flexible patterning using masks.

Another existing way to effect structural modification on a silicon nitride-coated semiconductor wafer is wet chemical etching. This can be done on the benchtop using hydrofluoric acid and, less commonly, hot phosphoric acid (both approaches require specialized labware for safety), but would require an initial photolithography step for spatial control over material removal. Moreover, after this step, this process may still be compromised by its inability to anisotropically etch the amorphous $SiN_x$.

Therefore, while there have been attempts at solving the issue of structurally modifying commercially available silicon nitride-coated semiconductor wafer without resorting to capital-intensive investment in cleanroom facilities, the results are far from satisfying when these methods are practiced by themselves and the need for better solutions remains strong.

SUMMARY OF THE INVENTION

The present invention provides a new method to effect rapid, general-purpose patterning of a wafer substrate, with or without coating(s) such as silicon nitride thin films, under standard sea-level atmospheric pressure for applications including but not limited to the fabrication of microfluidic channels and of substrates for Surface-Enhanced Raman Spectroscopy (SERS) and other optical-based technologies, including optical waveguides, tip-enhanced Raman spectroscopy (TERS), and photocatalysis. The resulting substrate surface is novel, easy to make and primed for further surface modifications if so desired.

According to a method embodiment of the present invention, a semiconductor substrate, such as a silicon wafer useful in the micro- and nano-fabrication fields, is exposed to a plasma-containing electric discharge from a discharger, e.g., a Tesla coil device to ablate or roughen the surface. Non-limiting examples of the discharger include a hand-held plasma wand, and a flameless lighter such as ones used for lighting cigarettes. The wafer substrate is coated with a thin film of an electric insulator or chemical barrier or free of such material(s). Non-limiting examples of such coatings include silicon nitride film(s), e.g., as coated on a silicon substrate, and metal films such as coinage metals including but not limited to gold, silver and copper.

Methods of the invention are practiced to remove portions of or even an entire protective film from a substrate surface. When coated with a thin film of certain material(s) including silicon nitride and certain SERS-capable metal(s), the wafer surface can be used as a SERS-ready substrate. Non-limiting examples of such SERS-capable metals include gold, silver, copper, platinum, titanium, chromium, and combinations thereof. In one exemplary embodiment, silicon surfaces can be coated with both silicon nitride and sputtered gold. In other embodiments, methods of the invention are practiced on pure silicon wafers and silicon carbide wafers. Sputtered gold generally produces an unstructured gold film, but it is also contemplated by the present invention to deposit nanostructured gold films in order to further enhance the SERS signal magnitude.

In a preferred embodiment of the invention, a plasma generator, such as a handheld Tesla-coil lighter, is employed to produce spatially localized damage of thin (e.g., ~200 nm) $SiN_x$ films on a Si wafer: this damage spot provides wet chemical access to the underlying Si semiconductor that allows further material processing, and the remainder of the $SiN_x$ film continues to serve as an effective etch stop for wet etching of Si. The localized damage can be converted into a larger-scale pattern by using a hard mask or by rastering of the lighter across the surface. For suitable targets, the present invention thus effectively replaces a much more complicated, labor-, time- and equipment-intensive conventional approach to patterning of these materials that otherwise may require photolithography and RIE.

The present invention shows an ability to deterministically modify existing nanostructures on a larger scale, such as patterning and establishing vias through thin films of $SiN_x$—thus serving as a low-barrier adjunct to traditional micro- and nanofabrication tools and methods. In particularly preferred embodiments, the use of plasma-based patterning was adapted to deliver two different applications. The first was the formation of a microscale fluid channel within the bulk silicon wafer underlying the $SiN_x$ thin film. The 170 μm lateral dimension of the channel was controlled by the glass slide masks and Tesla-coil discharge extent while the 160 μm depth was controlled by the wet etching time. The second was the fabrication of a SERS substrate by using Tesla-coil exposure to provide the necessary substrate surface structure, and simple sputter deposition of an essentially unstructured gold thin film to provide the coinage metal surface. SERS enhancement was generated by gold-coating damage marks, and thus the location of enhancement could be readily controlled. Detection of a canonical test molecule, NBT, was demonstrated at a concentration of 1.6 ppm. Similar total signal was detected from both a delicately nanostructured commercial SERS substrate and the substrate fabricated from a Tesla-coil-damaged chip. The Tesla-coil thus holds substantial potential in the hands of practitioners needing only simple tools to create or modify micro- and nanostructures without the barriers to entry or practice of more conventional fabrication methods and tools.

A basic embodiment of the present invention can be described as a method of removing portions of a thin film of an electric insulator or chemical barrier from a surface of an underlying substrate and roughening the underlying substrate, provided that, in some instances, no liquid etching solution is used on the thin film before or during the following steps: (a) placing a substrate, coated with a thin film comprising an electric insulator on at least one of the substrate's surfaces, in between two electrodes that are each electrically connected to a plasma generator; and (b) activating the plasma generator to discharge a plasma-containing electron beam or arc upon the thin film, thereby removing portions of the thin film from the entrance side and roughening the underlying substrate by the beam or arc.

A further embodiment of the invention can be characterized as a method for providing a substrate that can conduct Surface-Enhanced Raman Spectroscopy (SERS) thereon, with the following steps: (a) placing a substrate in between two electrodes that are each electrically connected to a plasma generator; (b) activating the plasma generator to discharge a plasma-containing electron beam or arc upon the thin film, thereby removing portions of the substrate from the entrance side by the beam or arc; and (c) subsequently coating the entrance side with a SERS-capable metal. Optionally, the entrance side is treated with an etching chemical in between steps (b) and (c). In a preferred embodiment, the substrate is a semiconductor such as silicon or any other material suitable as a support.

A yet further embodiment of the invention can be characterized as a method for fabricating a microfluidic channel on a substrate coated with a thin film barrier, using steps as follows: (a) placing a substrate, coated with a thin film comprising a barrier on at least one of the substrate's surfaces, in between two electrodes that are each electrically connected to a plasma generator; (b) activating the plasma generator to discharge a plasma-containing electron beam or arc upon the thin film, thereby removing portions of the thin film barrier in the form of a preliminary channel from the entrance side by the beam or arc; and (c) subsequently contacting the entrance side with an etching chemical to deepen the preliminary channel into desired channel dimension. In a feature, the method further includes a step of placing a pattern guide, comprising an electric insulator (e.g., glass) and formed with an opening, adjacent the thin film before step (b) to guide the electron beam or arc.

The foregoing and other objects, aspects, features, and advantages of the invention will become more apparent from the following description and from the claims.

BRIEF DESCRIPTION OF THE DRAWINGS

The objects and features of the invention can be better understood with reference to the drawings described below, and the claims. The drawings are not necessarily to scale, emphasis instead generally being placed upon illustrating the principles of the invention. In the drawings, like numerals are used to indicate like parts throughout the various views.

FIGS. 2A-2E schematically illustrate exemplary embodiments of selectively damaging $SiN_x$-coated Si wafers with a Tesla-coil lighter discharge, including patterning for subsequent wet etching as part of a microfabrication process according to the invention. FIG. 2A shows direct, unmodified wafer exposure to plasma discharge. FIG. 2B shows patterned exposure through a copper grid mask. FIG. 2C shows direct exposure with a grounded plate at the bottom of the wafer. FIG. 2D shows channel formation between glass slide masks. FIG. 2E shows wet KOH etch outcomes after specified exposures to Tesla-coil. Thicknesses of silicon nitride films and silicon wafers are not drawn to scale.

FIG. 3A shows a $SiN_x$-coated wafer placed securely between two terminals connected respectively to two electrodes of a Tesla-coil lighter and FIG. 3B shows a closeup of the wafter when a plasma-containing arc was discharged onto it.

FIGS. 4A and 4B were taken after 1-second exposure of the front and back of the chip, respectively; FIGS. 4C and 4D were taken after 5-second exposure of the front and back of the chip, respectively.

FIGS. 6A-6D are cross-sectional SEM images of damaged spots after being exposed to plasma beam as depicted in FIG. 2A. In both FIGS. 6A and 6B, plasma exposure time was 3 seconds and the electrode was 2 mm from the silicon nitride film. The plasma beam left divots in the underlying silicon in FIG. 2A but not in FIG. 2B where the 0.2 μm thin film $SiN_x$ layer remains intact (the evident damage spot protrusions occur further away from the cleavage edge but are visible owing to the finite depth of focus). The electrode-to-film distance was 1 mm in both embodiments shown in FIGS. 6C (10-second plasma exposure) and 6D (30-second plasma exposure). In addition to greater depth of damage with increasing exposure time, there was an accompanying greater degree of infilling of the damage spots.

FIG. 7 are photographic images of damage areas resulting from practicing the method embodiment according to FIG. 2B: in the left column, the illumination was configured to image all surface features; in the right column, the optical axis of the camera was orthogonal to the surface and illumination was direct so that only scattered light would be imaged. Scale bars are 0.5 mm. From top to bottom, the $SiN_x$ chips were masked with a 400, 200, and 50 mesh copper TEM grid.

FIG. 8A is a photographic image of a cut-out paper stencil placed above 1-mm ruler markers and used to practice an embodiment of the invention. FIGS. 8B-8D are photographic images of plasma damage marks on the plasma entrance side of $SiN_x$-coated wafers after using a pantograph to trace the stencil of FIG. 8A at ~4× reduction in scale. The latter images are respectively: (FIG. 8B) as-generated damage spots; (FIG. 8C) subsequently etched in KOH for 10 minutes, with illumination configured to image all surface features; and (FIG. 8D) subsequently etched in KOH for 10 minutes, with illumination configured such that only scattered light was imaged.

FIGS. 9A-9E are photographic images of the $SiN_x$ film's exit-side after impact by plasma beams in accordance with principles of the invention. FIGS. 9A and 9B show plasma damage marks on the plasma exit side of $SiN_x$-coated wafers that were photographed in FIG. 8B under the same illumination, respectively, as in FIGS. 8C and 8D. FIG. 9C shows the exit side after a grounding plate was placed against it before the wafer was plasma-patterned. FIGS. 9D and 9E are electron micrograph: FIG. 9D shows exit face damage marks generated without a grounding plate (after practicing the method embodiment of FIG. 2A), and FIG. 9E shows the exit face in the presence of the grounding plate (after practicing the method embodiment of FIG. 2C).

FIGS. 11A and 11B are SEM images of Tesla-coil damaged $SiN_x$ (plasma entrance side) after gold coating with different magnifications.

FIG. 12 is a diagram summarizing the Raman spectra reading of the same concentration of an analyte, 4-nitrothiophenol (NBT), based on four different substrate surfaces: (1) commercial nanopillar array substrate prepared by reactive ion etching; (2) gold-coated plasma-roughened $SiN_x$-coated chips prepared according to the invention; (3) commercial $SiN_x$-coated chips with no additional treatment; and (4) plasma-roughened $SiN_x$-coated chips prepared according to the invention (gold-free).

DETAILED DESCRIPTION OF THE INVENTION

Figure 1B:
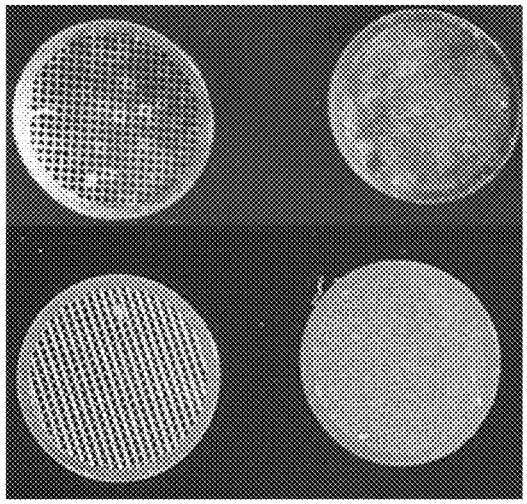
FIG. 1B shows some of copper mesh/grid being used in practicing an embodiment of the invention: top row shows the 200 mesh and the bottom row shows the 400 mesh. Each grid is shown as before use (left) and after (right) exposure to the Tesla-coil lighter discharge with the grids at right are shown their respective surface that had been in contact with the $SiN_x$ film.

Unless otherwise noted, technical terms are used according to conventional usage.

As used in the specification and claims, the singular form "a", "an", or "the" includes plural references unless the context clearly dictates otherwise. For example, the term "a cell" includes a plurality of cells including mixtures thereof. It is further noted that the claims may be drafted to exclude any optional element. As such, this statement is intended to serve as support for the recitation in the claims of such exclusive terminology as "solely," "only" and the like in connection with the recitation of claim elements, or use of a "negative" limitations, such as "wherein [a particular feature or element] is absent," or "except for [a particular feature or element]," or "wherein [a particular feature or element] is not present (included, etc.) . . .".

When a dimensional measurement is given for a part herein, the value is, unless explicitly stated or clear from the context, meant to describe an average for a necessary portion of the part, i.e., an average for the portion of the part that is needed for the stated purpose. Any accessory or excessive portion is not meant to be included in the calculation of the value.

As used herein, the recitation of a numerical range for a variable is intended to convey that the invention may be practiced with the variable equal to any of the values within that range. Thus, for a variable which is inherently discrete, the variable can be equal to any integer value within the numerical range, including the endpoints of the range. Similarly, for a variable which is inherently continuous, the variable can be equal to any real value within the numerical range, including the endpoints of the range. As an example, and without limitation, a variable which is described as having values between 0 and 2 can take the values 0, 1 or 2 if the variable is inherently discrete, and can take the values 0.0, 0.1, 0.01, 0.001, or any other real values >0 and <2 if the variable is inherently continuous.

As used herein, "about" means within plus or minus 10%. For example, "about 1" means "0.9 to 1.1", "about 2%" means "1.8% to 2.2%", "about 2% to 3%" means "1.8% to 3.3%", and "about 3% to about 4%" means "2.7% to 4.4%."

As used herein, the terms "to ablate," "ablating," "to damage," "damaging," and "ablation" refer to the act of removal of material(s) including the roughening, carving, channel formation, and patterned modification of a surface and possibly the underlying bulk or support.

As used herein, the terms "arc" or "arc discharge" refer to breakdown of a gas that generates an extended electrical discharge that typically produces a plasma with visible light.

As used herein, the term "coinage metals" refers to metallic chemical elements that historically have been used as part of an alloy to mint coins, and such elements include but are not limited to gold, silver, copper and combinations thereof.

As used herein, the term "infilling" refers to the density of damage spots in a given region where the plasma beam is aimed at. A higher degree of infilling indicates more complete material removal within a given boundary.

As used herein, the term "plasma" refers to gaseous substances that are ionized to the point of becoming highly electrically conductive and include charged gas ions and free electrons. The term "plasma discharge" or "plasma beam" as used herein, refers to an electromagnetic discharge involving plasma, such as an electric arc generated by a Tesla coil device.

As used herein, the term "SERS-capable" or "SERS-ready" refers to the ability to locally enhance the external incident electric field and/or to activate surface plasmon resonance (SPR), which is critical for enabling sensing Raman signals in optical-based technologies such as surface enhanced Raman spectroscopy (SERS).

As used herein, the term "silicon nitride" refers to any chemical compound consisting substantially of two elements only: silicon and nitrogen, such that it can be chemically represented as $SiN_x$ or $Si_xN_y$. The most thermodynamically stable amongst silicon nitride is $Si_3N_4$. A "silicon-rich" silicon nitride, as used herein, refers to a silicon nitride ($Si_xN_y$) where the ratio of "x" over "y" is greater than 0.75, i.e., x:y>3:4, e.g., where "y" is 4, "x" can be 4, 5, 6, 8, or more. Other examples of "silicon-rich" Si/N ratio in silicon nitride include: 0.77, 0.82, 1.02, 0.95, 1.14, 0.87, and so on (see Journal of Vacuum Science & Technology A: Vacuum, Surfaces, and Films 1996, 14, 2879). A silicon nitride thin film can be one or more layers of silicon nitride deposited on a semiconductor (e.g., silicon) base, and may contain other chemical elements over time such as oxygen when stored in ambient air.

As used herein, the term "thin film" refers to a layer of material deposited on a bulk substrate in order to impart properties that cannot be easily attained by the base material. Thin films of electric insulators and/or chemical barriers are used in the electronic and semiconductor industry. Typically, a thin film is no more than a few micrometers thick and can be as thin as a few nanometers. In a preferred embodiment of the present invention, a thin film is no more than 10 micrometers thick. In further preferred embodiments, a thin film is less than 5, 4, 3, 2, or 1 micrometer thick. In particularly preferred embodiments, a thin film is between 10 and 300 nm thick, both ends included.

We have previously demonstrated the ability to form, without resorting to conventional cleanroom technologies, nanofluidic conductors in free-standing $SiN_x$ immersed in deionized, ultrapure water by dielectric breakdown-initiated material removal (Bandara, Y. M. N. D. Y. et al., "Push-Button Method to Create Nanopores Using a Tesla-Coil Lighter," ACS Omega 2019, 4, 226-230). In the present invention, however, we provide novel methods to directly pattern thin films such as silicon nitride without additional processing or hardware, and without physical contact between the tool and the substrate/coating. The invention can be practiced with ambient air without the need for a vacuum or liquid bath.

Figure 1A:
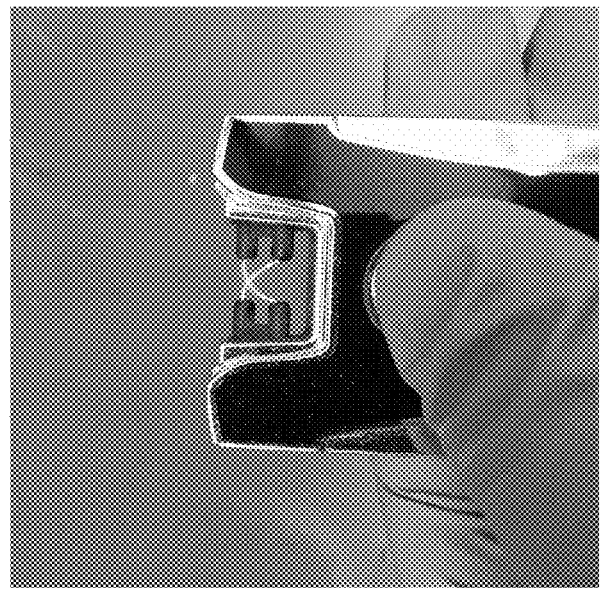
FIG. 1A shows a Tesla coil lighter useful in practicing embodiments of the invention. The particular one shown here has two pairs of electrodes.

The present invention offers the additional benefit of replacing, with a single operation, steps (1)-(6) of the example of conventional $SiN_x$ microfabrication process outlined above in the Background section. According to the principle of the invention, a semiconductor substrate, e.g., a silicon wafer, with or without a coating, is placed in between two electrodes or terminals electrically connected to a plasma discharger, e.g., a Tesla coil. A Tesla coil is a two-coil resonant transformer capable of producing high-voltage, high frequency alternating-current (AC) electricity at low-currents. Tesla coils can produce output voltages from about 10 kilovolts to above a million volts; the current output is in the low radio frequency range, usually between 50-1,000 kHz. In a Tesla coil device, such as a flameless lighter, when the charged capacitor is discharged, it ionizes the air between the electrodes in a spark gap, resulting in electric discharges in the form of one or more arcs (FIG. 1A). The particular model shown in FIG. 1A is commercially available and has four electrodes: when a user activates it by pressing down a button to close the circuit, two arcs of electric discharge are formed. Another preferred model has one pair of electrodes and produces just one arc. Both models and other suitable electrical device that is capable of producing a plasma-containing discharge/arc/electron beam can be used to practice the present invention.

FIGS. 2A-2E illustrate some embodiments of the invention. Without being limited to any particular theory, it is possible that dielectric breakdown, charging, thermal effects, and electron-beam-driven surface chemistry in air may all play a role in methods of the invention and influence their laboratory-observed results in material processing. A plasma discharge will conduct through a medium that normally is not electrically conductive such as air, or an optionally insulated semiconductor substrate like an optionally coated silicon wafer. Taking advantage of this overlooked phenomenon, our inventors have devised and tested various embodiments shown in FIGS. 2A-2D. In a most basic embodiment (FIG. 2A), a semiconductor substrate, e.g., a silicon wafer coated on both sides with thin layers of silicon nitride, is placed in the direct pathway of plasma discharge. No vacuum or other specialized facility is required, as the invention can be practiced under atmospheric pressure. In an exemplary embodiment, the wafer is off-the-shelf with dimensions indicated in these figures: without any barriers other than the thin layers of silicon nitride coating, the wafer is directly exposed to any plasma discharge from a plasma generator, in this case, a Tesla coil lighter. The wafer can be placed with some space, with nothing but ambient air, between it and the plasma generator's electrodes/terminals, e.g., no more than about 1.0 cm (possibly touching), preferably about 1.0-8.0 mm away. After a period of plasma exposure, e.g., to the electric arc from the Tesla coil lighter for as few as only a few seconds, asymmetric damage spots or patterns are effected on both sides of the semiconductor substrate, with the entrance side by the arc/plasma showing more pronounced damage than the opposing exit side. However, while the incident discharge appears spatially confined as one or more filaments/tracks, some instability in the discharge path appears to result in what can be described as "wandering" in the damage mark. The degree of localization of the damage appears dose-dependent, with longer exposure times allowing a greater degree of infilling in the still localized damage spot. Surprisingly enough, however, further testing confirmed that in such damage spots/areas, sufficient amount of the mask material (e.g., silicon nitride layer) has been ablated with just a short period of plasma exposure such that access to the underlying semiconductor material is allowed, e.g., for further chemical processing.

Some further embodiments of the invention are characterized with additional apparatuses that aim to pattern or guide the ablation effects from the plasma beam/current (FIGS. 2B-2D). In one embodiment, an electrically conductive pattern such as a metal mesh or grid, e.g., a flexible copper grid commonly used as sample supports for transmission electron microscopy (TEM) (FIG. 1B), is placed next to the arc/plasma entrance side of the semiconductor substrate, in an effort to guide or accentuate the ablation or roughening of the substrate, and to lessen or minimize the "wandering" (FIG. 2B). The addition of an electrically conductive pattern or guide resulted in visible modifications to the ablation, resulting in a higher degree of localization.

Figure 3B:
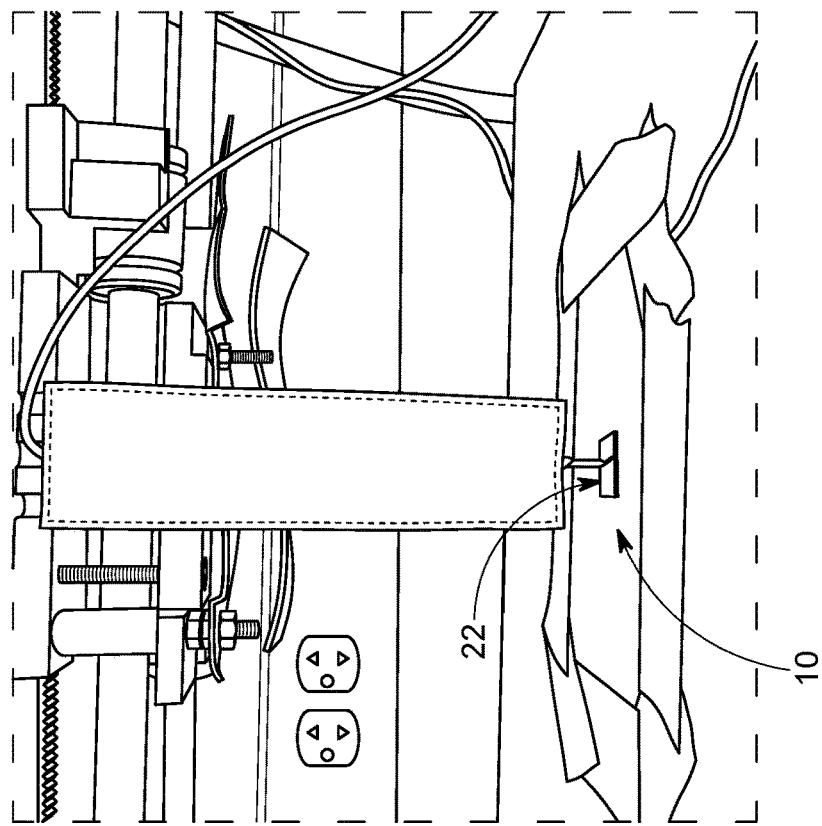
FIGS. 3A and 3B are photographic depiction of an embodiment of benchtop setup where the invention can be practiced.
Figure 3A:
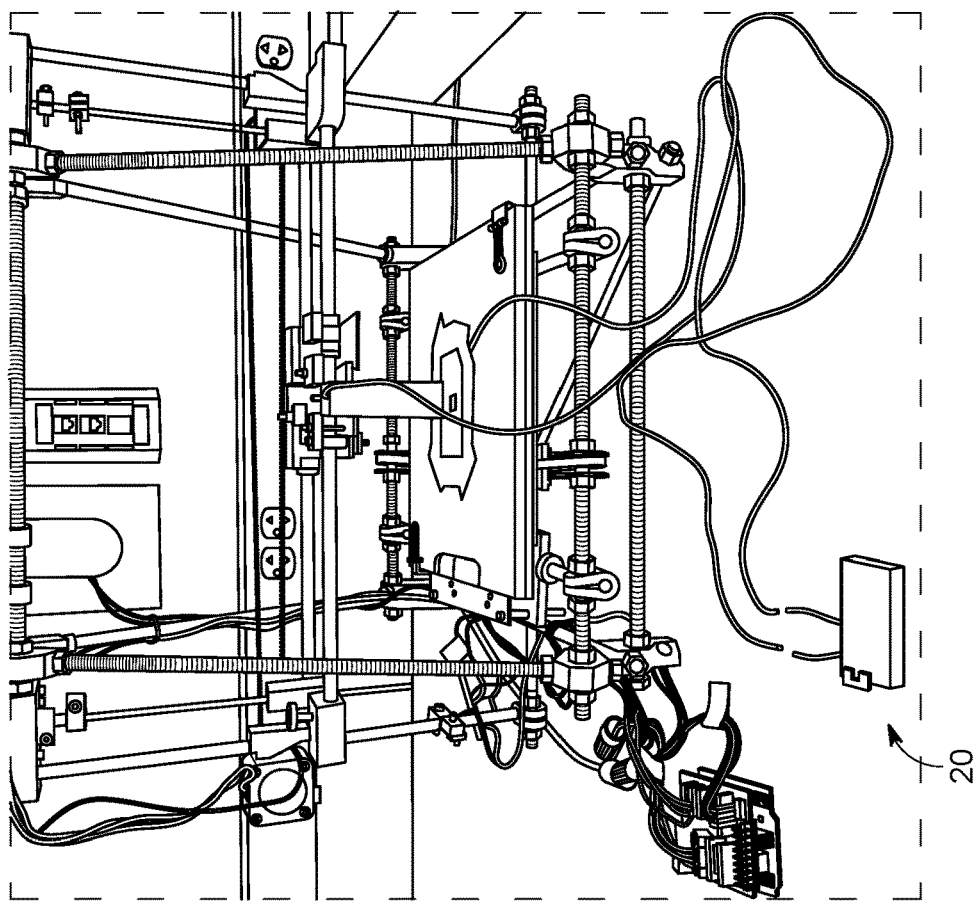

In another embodiment, contactless patterning is provided where the plasma/arc is guided to translate within a plane following a defined path, akin to rastering. This embodiment allows freehand patterning, with or without an optional guide, e.g., a stencil of any material. The use of a guide provides accuracy in patterning regardless of the practitioner's manual dexterity and provides repeatability. While this allows copying of an established or preformed pattern, a further inventive feature is added to enable changes in scale during the copying through the use of a pantographic device. In a particular embodiment, one end of a pantograph is attached to the plasma source, e.g., a Tesla-coil lighter, and the other end to a stylus confined within a guide, e.g., a paper cut-out stencil. The Tesla coil terminals are respectively placed on each side of the wafer section without making contact (as in FIG. 2A), and the stylus tip was in contact only with the stencil. The stylus is then used to trace the stencil pattern and the pantograph will cause the Tesla-coil lighter to replicate this motion, with either amplification or reduction in scale. The slower speed of travel by the lighter compared to the tracing stylus also aids in creating contiguous damage tracks. Of course, there are other ways to control the movement of the plasma-discharging electrode, including a computerized or robotically controlled gear that would be obvious to one skilled in the art. A simple example of that is shown in FIG. 3A and described briefly in the Example section.

In a further embodiment, largely to prevent plasma damage to the exit side of the substrate, a grounding plate is added on that side (FIG. 2C). The grounding plate can be made of a variety of materials, as long as it is electrically connected to a ground and is large enough to shield the desired area of the substrate. In an example, a glass plate wrapped in a metal foil (e.g., aluminum) is connected through a copper wire to a ground and placed next to the plasma exit side of the semiconductor substrate. The other side of the substrate, i.e., the plasma entrance side, faces the discharge terminal of the plasma generator with or without any intervening barrier similar to what is depicted in FIGS. 2B and 2A, respectively.

In yet another embodiment of the invention, a channel guide is added to the setup to form functional elements such as fluid channels in the underlying substrate (FIG. 2D). The channel guide can be any good insulator with high dielectric breakdown strength. For example, a channel guide can be a narrow gap between two blocks of glass that are placed adjacent the arc/plasma entrance side of the substrate, and the discharging electrode/terminal can be moving along the channel guide to focus its arc/plasma within the gap. Other means to guide and steer the electron beam include the use of conventional electron optics such as deflection plates, magnetic lenses, and electrostatic lenses. In other words, the beam can also be steered electrostatically or magnetically. Optionally, a grounding plate is placed on the arc/plasma exit side of the substrate similar to the setup shown in FIG. 2C.

It is further demonstrated that (1) the damaged spot/area from the initial exposure to the plasma beam could be minimally processed to provide access to the semiconductor material (e.g., silicon) underlying the damaged areas; and (2) the ostensibly undamaged regions of the coating, e.g., $SiN_x$ thin film, could be used to protect the underlying material in those regions. In essence, the $SiN_x$ film exposed to a plasma generator (e.g., a Tesla coil lighter) could serve as a hard mask for patterning the wet-etching (e.g., using a liquid etchant like KOH or HF) of the underlying Si wafer (FIG. 2E). Well-established within the canon of micro- and nano-fabrication techniques, an intact $SiN_x$ film serves as a KOH etch stop and should protect the underlying Si from etching (except at unprotected edges). According to the inventive principles disclosed herein, further wet etching is enabled at virtually all areas roughened with damage spots from the plasma beam including areas with exposure for as little as a few seconds, e.g., 1-5 seconds. This is true with substrates that have undergone plasma exposure as outlined in all the above-described embodiments including those depicted in FIGS. 2A-2D. For example, after using a channel guide to carve out a preliminary but narrowly defined damage track in the thin $SiN_x$ layer in accordance with the method outlined in FIG. 2D, further treatment in a KOH bath allows etching into the Si support at the bottom of the existing track to produce a microfluidic channel of the desired shape and dimension.

Applications

While the present invention provides means to ablate or remove a protective film such as a silicon nitride from a substrate for any purpose and to roughen the underlying substrate, it provides means to pattern such a substrate either by itself, or as an intermediary product ready for further processing of the underlying substrate. Accordingly, applications of the present invention include but are not limited to: as sample supports that provide effective transparency to charged particles and photons across a range of energies; as windows to interface instrumentation operating in vacuum to samples in ambient or liquid environments; as supports for nanopore single-molecule sensors for genomics, proteomics, and glycomics applications; as support for optical waveguides, and as housings for nanoapertures for filtration and controlled sample introduction and formation.

In particular, two areas of applications are worth further description here. The first application is the use of plasma/arc patterned $SiN_x$ as a hard mask to create a microfluidic channel in the underlying silicon wafer with subsequent wet chemical etching. This is illustrated particularly by the method embodiment outlined in FIG. 2D and the last portion of FIG. 2E. Example 7 below is dedicated to this application.

The second is to use plasma/arc-modified thin film substrates as a foundation for the fabrication of a substrate for surface-enhanced Raman spectroscopy (SERS) and other optical-based sensing technologies including other Raman-based techniques using similar SERS-ready substrates such as surface-enhanced resonance Raman spectroscopy (SERRS) and tip-enhanced Raman spectroscopy (TERS).

According to the present invention, the use of a plasma-generator such as a Tesla coil device can introduce a patterned enhancement without the need for preliminary patterned monolayer formation. Needed Raman enhancement can be provided by using substrates that are structured on the nanoscale as considerable effort has already been devoted to optimizing both the fabrication and sensing performance of SERS substrates. For instance, top-down nanofabrication steps developed in the art can yield exquisitely structured substrates, but rely on intensive and expensive fabrication steps. E.g., see, Perney, N. M. B. et al., Tuning Localized Plasmons in Nanostructured Substrates for Surface-Enhanced Raman Scattering. *Opt. Express* 2006, 14, 847-857. In an embodiment, commercially available Silmeco SERS substrates is used, and was tested as a benchmark during examples described below. These substrates consist of metallized high aspect ratio silicon nanopillars—with tunable dimensions, e.g., <100 nm in diameter and ~1 μm long—that can tilt together during solvent evaporation to form (self-assembled) SERS hot spots. These nanopillars are produced by maskless reactive ion etching (RIE) followed by a variety of preparation and deposition steps.

EXAMPLES

Materials used for all the examples below, unless stated otherwise, were as follows: Silicon nitride-coated wafers were purchased from Rogue Valley Microdevices, Inc. (Medford, OR), and consisted of 200 nm-thick, low-stress (<250 MPa Tensile; silicon-rich), LPCVD (low-pressure chemical vapor deposition) $SiN_x$ films deposited on double-polished, 356±25 μm-thick, 3" diameter, <100> polished, P/Boron-doped (1-20 Ω·cm resistivity) silicon wafers. Flameless Tesla-coil lighters were purchased from Tesla Coil Lighters (California and China): single arc (ASIN: B016P8A1K4/UPC: 849344046936/Model H&PC-64671) and dual arc (ASIN: B01A02F714/UPC: 849344050544/Item model number: H&PC-65026). A custom jig was 3D printed to accurately and reproducibly position the wafer 10 relative to the lighter 20's terminals 22 (FIGS. 3A and 3B). TEM grids (G50-Cu, G200-Cu, G400-Cu) were purchased from Electron Microscopy Sciences (Hatfield, Pa. 19440). Semiconductor grade potassium hydroxide (99.99% trace metals basis, product #306568), anhydrous acetonitrile (99.8%, product #271004), and 4-nitrothiophenol (technical grade, 80%, N27209; abbreviated NBT) were purchased from Sigma-Aldrich (now Millipore Sigma, St. Louis, Mo.). Raman spectra were acquired with a Snowy Range Instruments, Sierra 2.0 spectrometer operating at 785 nm and 100 mW, with its orbital raster scanning mode disabled. Benchmark SER spectra were recorded using a gold SERS substrate from Silmeco ApS (Copenhagen, Denmark). SER substrates were soaked in 1.6 ppm solutions of 4-nitrothiophenol in acetonitrile for 5 minutes before being removed and air-dried after wicking excess liquid away with a Kimwipe. Electron micrographs were recorded using a Zeiss SIGMA VP Field Emission-Scanning Electron Microscope (FE-SEM) and gold coatings were deposited for 20 seconds using a Cressington 108 Auto gold sputter coating system operated at 30 mA currents during deposition.

Example 1

Figure 4E:
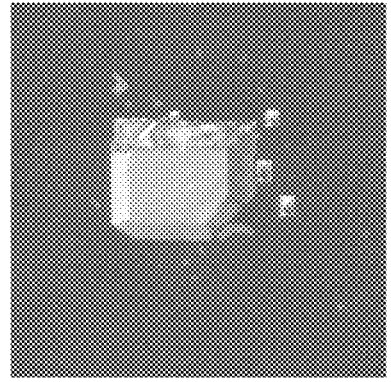
FIG. 4E is a photographic depiction of the same spot from FIG. 4C after a subsequent 30-minute KOH etching. All frames are sized to 15 mm×15 mm.
Figure 4B:
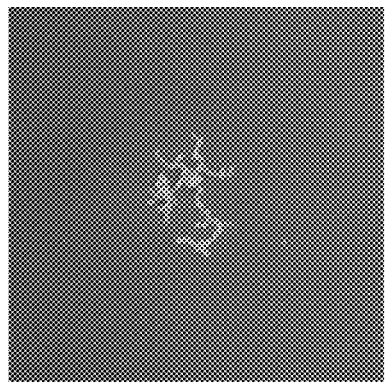
FIGS. 4A-4D are photographic depiction of exemplary damage areas resulting from practicing the method embodiment according to FIG. 2A.
Figure 4D:
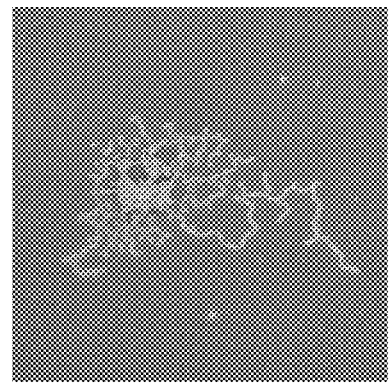
Figure 4A:
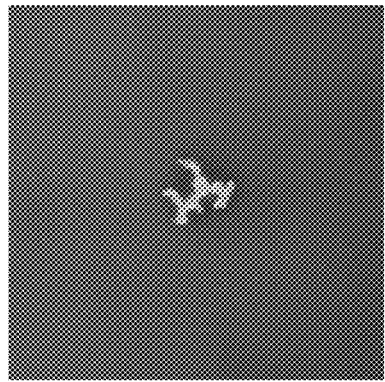
Figure 4C:
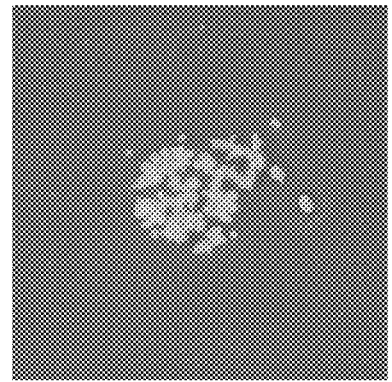

Double-sided $SiN_x$-coated Si chips were inserted between the terminals of the Tesla coil lighter (FIG. 2A), which did not prevent transmission of the intensive electrical discharge in the form of a plasma-containing arc, and resulted in visible discoloration of the chips spatially localized to where the plasma-containing arc passed, as shown in FIGS. 4A-4D. Two different damage patterns could be identified, consistently depending on whether the lighter discharge was incident upon the $SiN_x$ through air (entrance face; fairly well-defined spots) (FIGS. 4A and 4C), or through the Si wafer (exit face; more dispersed, thread-like damage tracks) (FIGS. 4B and 4D).

The character of the two types of spots could be readily understood in a mean-free-path framework. While the incident discharge always appeared spatially confined as a filament, the track tended to contain visible "wandering" extensions showing some degree of breakdown in the discharge path. This "wandering" marked loss of energy in the process, making the degree of localization of the ablation dependent on the energy dose, with longer exposure times allowing a greater degree of infilling of the still localized damage spot.

Figure 5B:
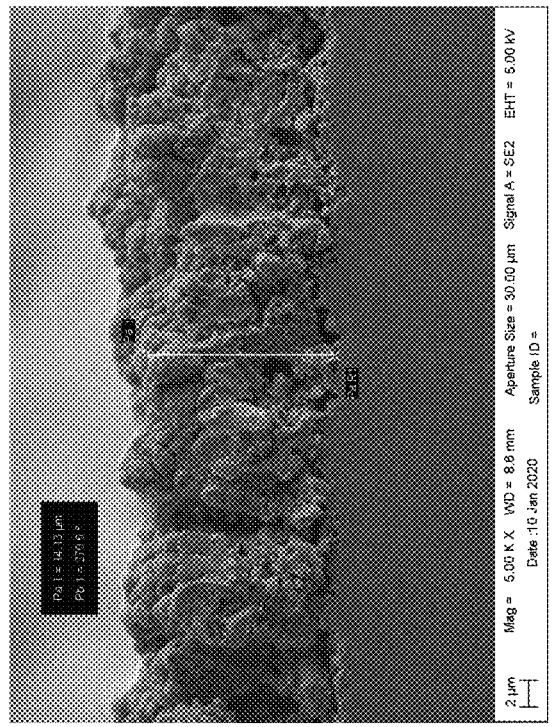
FIGS. 5A and 5B are cross-sectional scanning electron microscopy (SEM) images showing details of ablation or damage on the wafer's entrance film side from practicing an inventive embodiment according to FIG. 2A. Wafers were exposed to the Tesla-coil discharge before being cleaved through the resulting damage spots. Exposure time to the discharge was 3 seconds in FIG. 5A and 30 seconds in FIG. 5B, both at an electrode distance of 1 mm.
Figure 5A:
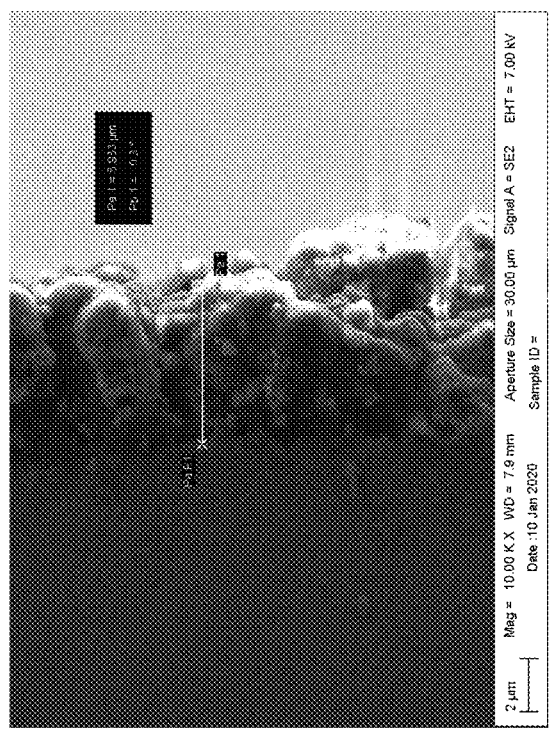

FIGS. 5A and 5B are electron micrographs of two entrance side damage spots. The thickness of the damaged region increased from about 6 micrometers to about 14 micrometers, as plasma exposure time increased from 3 to 30 seconds. Therefore, on a micrometer length scale, thickness of the damaged region at both durations easily exceeded the thickness of the thin $SiN_x$ film, which was originally about 0.2 micrometers. While not all of the observed roughened and damaged region consists of the original coating (see Example 2 below with regard to changes in the chemical compositions), the thickness of the damaged region showed definitive capacity for the plasma beam to penetrate the silicon nitride coating and reaching the underlying silicon bulk. Also can be seen in the scans, the Tesla-coil discharge produced a highly textured (pebbled), ostensibly porous, layer that had a clear lower boundary with an appreciable extent of the underlying silicon wafer that showed only microscopic evidence of damage that is localized within the damage spots.

Just to be clear, that is not to say that the plasma beam did not reach or could not remove some material from the underlying semiconductor support: cross-sectional SEM imaging revealed that the damage tracks penetrated on the micrometer length scale (e.g., about 4-5 µm) into the underlying silicon of the wafer, forming divots 30, with no visible evidence of intact $SiN_x$ film remaining within the damage spot (FIG. 6A) while the $SiN_x$ thin film outside of the damage tracks remained intact (FIG. 6B) despite being within the circular zone 40 (marked in dash line) that is being impacted (FIG. 6C).

The damage spots at short exposure times were formed from isolated damage tracks traversing regions of intact $SiN_x$ film. A lower degree of damage spot infilling and greater lateral extent of travel of the damage tracks was observed as the discharging electrode was moved further away from the film at this short exposure time (e.g., 3 seconds). This was consistent with projection of the angular fluctuations onto the film surface. As plasma exposure time increased, e.g., from 10 to 30 seconds (FIGS. 6C and 6D), the degree of homogeneity of the damage spots also increased, showing higher density of impacted spots as exposure time lengthened. In other words, two stages of damage spot formation have been observed. In the first and initial stage, plasma beam exposure is low enough so that one can detect individual damage track paths with unexposed regions in between. Then, without mechanically moving the electrodes, beam wandering begins to damage the previously undamaged regions, thereby filling in the final damage spot. The degree to which there are two stages is dependent on the beam current and the exposure time—or, integrated to the total electron dose.

Example 2

Elemental analyses were conducted of coated chips exposed to the plasma beam as described in Example 1, which revealed that the Tesla-coil-induced damage was not merely physical but accompanied by chemical changes as well. Energy-dispersive X-ray (EDX) analysis of damage spots showed compositional changes at the damage spot relative to intact $SiN_x$ film (data not shown here). A decrease in nitrogen content was accompanied by an increase in oxygen content. The spatial distribution of this chemical change overlapped with the visible extent of the damage spot, with the underlying undamaged region comprised of chemically unmodified silicon. Damage tracks formed by the Tesla-coil lighter were thus demarcated by pitting of the Si wafer, formation of a convoluted overlayer, and local chemical changes.

Example 3

To demonstrate that: (1) the damaged spot could be trivially processed to provide access to the material underlying the damage; and (2) the ostensibly undamaged regions of the $SiN_x$ thin film could be used to protect the underlying material in those regions, $SiN_x$-coated Si wafers exposed to Tesla-coil lighter discharges as in Example 1 further underwent wet etching in KOH bath (FIG. 2E). We were able to KOH etch even the shortest duration damage spots that were tested, confirming that the $SiN_x$ film exposed to the lighter could serve as a hard mask for patterning the wet-etching of the underlying Si wafer.

FIG. 4E shows the formation of a KOH etch pit where the Tesla-coil (5 s exposure) had visibly discolored the $SiN_x$ film. The etch pit profile was consistent with anisotropic KOH etching of the underlying crystalline Si (here, 30 minutes in an ~8.9 M KOH solution at ~80° C.). The etch pit formed where the initial Tesla-coil damage spot had been evident—with no additional processing carried out—and the etching process "filled-in" the fine structure present in the damage spots, possibly due to KOH etching of less evidently damaged areas of the $SiN_x$ between the damage tracks, or merging of adjacent etch pits, or both. Regardless of mechanism, the combination of Tesla-coil-exposure and KOH etching produced an etch pit at a specific location and with spatially limited margins, i.e., with a well-defined boundary.

Thus, while the discharge path fluctuated, unexposed regions of the thin film were unharmed and patterning of the $SiN_x$ film could be used to (1) pattern a 200 nm thin-film structure and (2) govern patterning of the underlying structure: the method thus offers demonstrable capabilities as a rapid, low-barrier alternative to lithography—demonstrated on a thin film material often chosen for its resistance to removal.

Example 4

Following the demonstration that the Tesla coil lighter could induce damage to the $SiN_x$ thin film that was compatible with subsequent processing and structuring of the underlying substrate, two different routes were used to patterning the damage to the film: (1) patterning through a physical mask (FIG. 2B), and (2) contactless patterning by translating the lighter through defined paths (Example 5).

In the present example, flexible TEM copper grids were placed, shiny-side down against the chips, before the two-terminal Tesla-coil lighter was discharged with a single discharge path. The resulting images in FIG. 7 were taken from the entrance film side—the side proximal to the terminal that would produce well-defined spots in the absence of a metal grid mask. Exposure times did not exceed ~30 s, and the Tesla-coil was manually passed over the entire grid area, with fluctuations in the discharge path itself providing additional spatial sampling across the grid.

The metal (e.g., copper) mask offers two properties to an electric-discharge-based patterning method: density, and conductivity. The electrically conductive mask is on top of an insulating thin film where the discharge is able to transmit through the entire wafer and also able to damage the thin film with increasing exposure time (Example 1). Thus, while the copper grid was electrically floating at the beginning of the exposure, the electrical potential on the grid was likely variable in complex ways during the course of the exposure. FIG. 1B shows photographs of two grids before and after being uses as masks: there was evident discoloration, suggesting damage, to the copper grid masks by the Tesla-coil discharge. With high-field electric discharges, the role of microscopic asperities may further complicate transient electric field distributions and allow for localized discharges accompanied by microscopic losses of grid material.

The images shown in FIG. 7 show exemplary results from the use of a copper grid for patterning plasma-inflicted damage on a wafer coated with silicon nitride thin film. Two points need to be emphasized. First, the physical masking was able to control and guide the Tesla-coil patterning. Second, the variation in damage pattern with mesh size—50 mesh (420 μm hole, 80 μm bar), 200 mesh (90 μm hole, 35 μm bar), and 400 mesh (37 μm hole, 25 μm bar)—offered an interesting trend. The 50-mesh, with large open area, showed that the damage was localized to the grid bars, principally underneath the bars but also extending outward from them. In the 200-mesh patterning, the damage underneath the bars was limited in extent compared to the damage in the open areas. Nevertheless the central portion of the thin film underneath each grid opening was largely undamaged in this mesh size, suggesting that the damage was originating not by direct bombardment of the Tesla-coil discharge, but from discharge from the grid. In the 400 mesh patterning, the damage spots appeared to be infilled underneath the openings in the grid, but largely absent underneath the wires.

Thus, patterning of the damage spots is affected by how close together the individual metal elements in the pattern guide are to each other and how large the openings are between those elements. Suffice to say, for purpose of the present invention, the addition of an electrically conductive pattern guide adjacent the incident/entrance film side can further localize the damage and reduce lateral displacement, i.e., wandering. In a preferred embodiment, such a pattern guide has individual elements such as metal bars that are spaced far apart from each other to avoid crosstalk and proximity interference. The exact requirement on how spaced apart the elements can be easily determined by one skilled in the art and through simple tests, and is not detailed here. The focus of the microfabrication effort in this example, however, was to augment, by even microscale patterning, the nanoscale vertical feature size given by the 200 nm film thickness, which was not difficult to achieve with the aid of a metal pattern guide.

Example 5

Another embodiment of the invention enables patterning the spatially confined discharge of the Tesla-coil lighter through rastering-like movements that translate within a plane following a defined path.

The compact, hand-held Tesla-coil lighter allows for freeform patterning, but it was desirable to produce patterns without using a mask and that would be smaller than could readily be produced by hand. Accordingly, in the present example, a contactless guide, e.g., a cutout stencil (FIG. 8A) was used to pattern the damage or ablation. Further, a pantograph was used to reduce the pattern scale, e.g., by about fourfold. One end of a pantograph was attached to the Tesla-coil lighter and the other end to a stylus confined within a cut-out stencil. The Tesla coil terminals were placed on either side of the wafer section without making contact (as in FIG. 2A), and the stylus tip was in contact only with the stencil. The stylus was then used to trace the stencil pattern and the pantograph caused the Tesla-coil lighter to replicate this motion, although with purposefully fourfold reduced travel.

The stylus diameter allowed for the pattern on the $SiN_x$ to be traced as an outline, as shown in FIGS. 8B-8D. Subsequent KOH etching was carried out for 10 minutes (FIG. 2E), and as shown in FIGS. 8C and 8D, the etching broadened the spatial extent of the visible damage, improving the contiguousness of the structural modification of the film.

Example 6

In FIGS. 4A-4D, it was demonstrated that there are visible differences in the damage spot quality between the entrance and exit sides of the wafer section. On the entrance side the spots were better defined, and on the exit side the spot integrity was diminished. The same general behavior was observed in the patterning experiments. It was difficult to discern exit-face patterning when using the copper grid masks, owing to the small feature size of the masks, the rudimentary implementation, and the inherent differences in entrance and exit face damage spot quality and extent. For the raster-based, mask-free patterning, the exit face pattern quality was also distinct from the entrance face quality, but with the overall pattern remaining clear. FIGS. 9A and 9B illustrate that the exit face damage marks had two prominent zones: a sharply defined set of damage marks surrounded by a more diffuse halo. However, the asymmetric patterning quality between entrance and exit faces is a concern only in those special applications where both films must be patterned. $SiN_x$ thin films are conventionally deposited in one fabrication step onto both sides of a wafer even when only one side will be used as a patterned mask (as in the $SiN_x$ window formation example enumerated above) or structural element. Thus, the ability here to robustly pattern only the entrance thin film is not inherently a limitation. And as shown in at least two applications below, any damage to the exit side film is irrelevant to the function arising from the entrance side film patterning.

In the present example, a method embodiment of the invention is utilized to prevent visible damage to the exit side film by placing a grounded plate adjacent to it, here a microscope slide wrapped in aluminum foil connected by wire to an electrical outlet ground (FIG. 2C). In this case, damage was observed on the entrance side of the wafer of interest, but not on the exit side (FIG. 9C). FIGS. 9D and 9E are electron micrographs that illustrate the ability of the grounding plate to suppress the formation of even microscopic damage marks on the $SiN_x$ film of the exit side. While the entrance side could be etched with KOH, there was no etching visible on the exit side, further indicating an absence of damage to the exit side $SiN_x$ thin film.

Example 7

Figure 10:
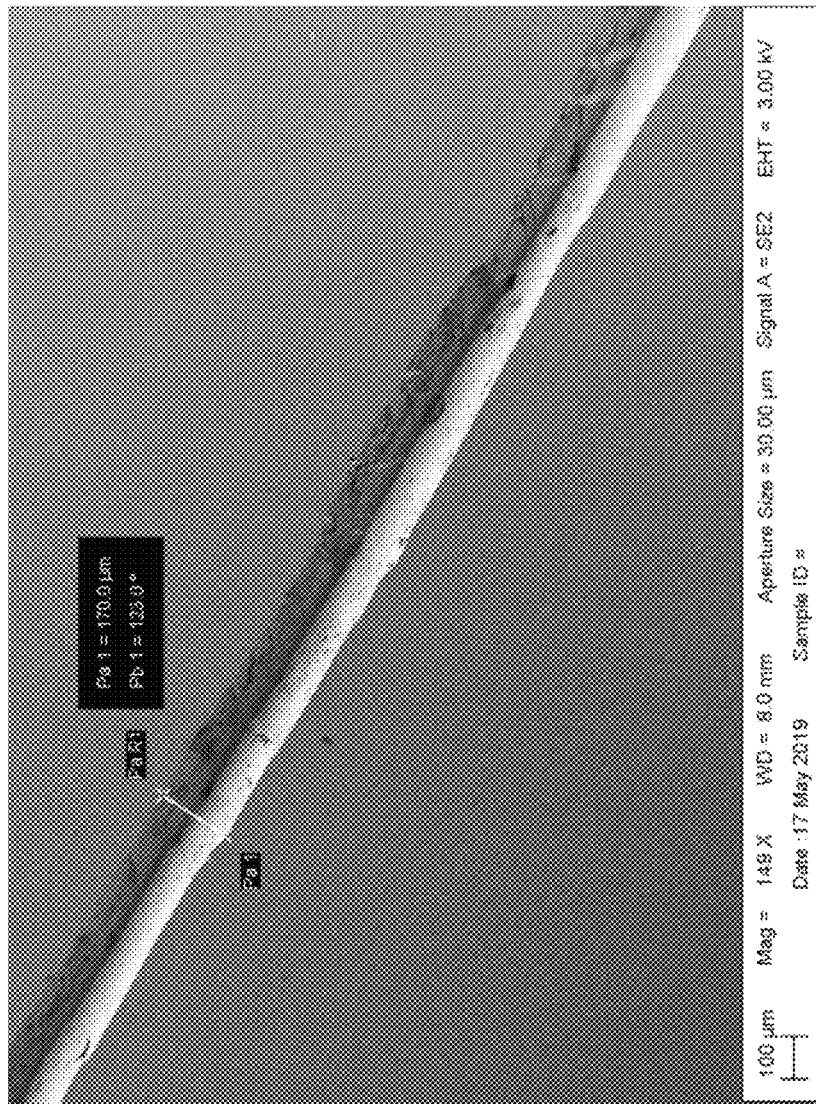
FIG. 10 is an SEM image of a wet-etched (30 minutes in 8.9 M KOH at 80° C.) microchannel patterned by Tesla-coil discharge through the gap between two abutted glass slides on the plasma incident side of the substrate, according to an embodiment of the invention.

In this example, functional elements such as fluid channels in the silicon wafer were formed in accordance with the principle of the present invention. Two clean glass microscope slides were taped together with their longer edges flush with each other, thereby providing a very thin guide channel. The wafer was placed onto the grounded backing plate as in the setup shown in FIG. 2D (and FIG. 9C) and a free discharging electrode was passed back and forth along the guide channel while discharging, at a manual scan rate of ~1 cm/s. The damaged substrate was then placed into an 8.9 M KOH etch bath at 80° C. for 30 min (FIG. 2E) to produce the fluid channel shown in FIG. 10. The walls of the channel were angled, meeting at an apex at the bottom, consistent with anisotropic KOH etching of the <100> polished Si wafer. EDX analyses were consistent with formation of a fluid channel in a region free of $SiN_x$ thin film. Oxygen enrichment was found to be colocalized with the etch-exposed silicon in the channel, consistent with results from other examples.

In a preferred embodiment, the glass guide slides made good contact with the substrate. The channel dimensions were 170 μm across and 160 μm deep, with the depth set by the etching duration. There was no need to take precautions to protect the exit face SiN$_x$ film from being damaged because the desired feature never reached that side of the wafer.

Example 8

As shown in electron micrographs of the entrance surface post-Tesla-coil treatment presented in this disclosure (e.g., FIGS. 5A and 5B), dramatic surface roughening and the formation of features from pores to grains, with grain size distribution across a range of length scales, were achieved using the inventive methods. In terms of applications, planar, polished SiN$_x$ thin films have previously been used to support nanostructured gold films that provide the necessary enhancement for SERS. See Karawdeniya, B. I. et al., General Strategy to Make an on-Demand Library of Structurally and Functionally Diverse SERS Substrates. *ACS Applied Nano Materials* 2018, 1, 960-968. According to an embodiment of the present invention, a coating of a SERS-capable metal may also be used here on plasma-damaged surfaces to produce hot spots useful in optics-based sensing technologies such as SERS.

SiN$_x$-coated Si wafers were exposed to Tesla-coil discharges according to the method embodiment depicted in FIG. 2C, i.e., with a grounding plate on the exit side (~90 s exposure at 1 mm electrode distance), and gold coating was subsequently added by sputtering for about 20 s. Voids and surface texture were evident in the resulting entrance surface at lower magnification (FIG. 11A), and the presence of grains on a number of length scales was evident at higher magnification (FIG. 11B).

The Tesla coil treatment thus could produce entrance surface patterning on two broad length scale classes: on the dimension of the discharge and how far it was translated, and the microscopic length scales seen in FIGS. 11A and 11B. The highly structured damaged surface in FIGS. 11A and 11B provides features (1) on length scales that could be leveraged for providing enhancement for SERS and (2) with high local surface area that can be beneficial for SERS. In a preferred embodiment, the processed substrate is sputter-coated with gold, and the resulting gold films allow any enhancement to be dominated by the underlying morphology of the damage spot as the gold film itself offers no additional, well-defined nanostructure.

Indeed, control studies confirmed that the SERS signal was generated only by the combination of damage and gold coating, not either in isolation. As summarized in FIG. 12, using identical spectrometer settings and 1.6 ppm analyte concentrations, the maximum signal intensity from the Tesla-coil-prepared gold-coated substrate was nearly identical to the signal intensity produced using the commercial nanopillar array substrate prepared. No SER spectra were detected from the as-supplied SiN$_x$-coated chips or gold-free Tesla-coil-damaged chips.

Therefore, the Tesla-coil can be used to create SERS-active regions of the substrate surrounded by undamaged regions without enhancement, as tested by direct SERS measurement. This spatially patterned enhancement was achieved by a uniform gold deposition step—subject to line-of-sight effects—of a thin gold layer across the entire surface where the only patterning was provided by the Tesla-coil damage. The patterned response was straightforward to achieve by Tesla-coil treatment of the SiN$_x$-coated chips, as opposed to the greater procedural complexity required to achieve spatially localized enhancement by a method such as patterned electroless deposition. The ease of SERS substrate fabrication by Tesla-coil was even more marked compared to the fabrication of the highly refined, nanopillar-array-decorated, commercially available Silmeco (Copenhagen, Denmark) SERS substrate. Using the same 1.6 ppm solution of a canonical test molecule, NBT solution, practitioners of the present invention were able to record SER spectra of comparable quality from the commercial and extemporaneous substrates. Aside from the ability to so easily control the optical performance of the substrate, there may be more general uses of the fabrication paradigm of patterning a base layer followed by a spatially uniform deposition step.

While the present invention has been particularly shown and described with reference to the structure and methods disclosed herein and as illustrated in the drawings, it is not confined to the details set forth and this invention is intended to cover any modifications and changes as may come within the scope and spirit of the following claims. All publications and patent literature described herein are incorporated by reference in entirety to the extent permitted by applicable laws and regulations.

What is claimed is:

1. A method for removing portions of a thin film of an electric insulator from a surface of an underlying substrate and roughening the underlying substrate, the method comprising the steps of:
   (a) placing a substrate, coated with a thin film comprising an electric insulator on at least one of the substrate's surfaces, in between two electrodes that are each electrically connected to a plasma generator; and
   (b) activating the plasma generator to discharge a plasma-containing electron beam or arc upon the thin film, thereby removing portions of the thin film from the entrance side and roughening the underlying substrate by the beam or arc;
   provided that no liquid solution is used on the thin film before or during the above two steps.

2. The method of claim 1, wherein the plasma generator comprises a Tesla coil device.

3. The method of claim 2, wherein Tesla coil device comprises a lighter comprising a spark gap where an electric arc is formed upon activation.

4. The method of claim 1, wherein the thin film comprises silicon nitride.

5. The method of claim 4, wherein the silicon nitride is silicon rich.

6. The method of claim 1, wherein the substrate comprises a semiconductor or an insulator.

7. The method of claim 1, wherein the substrate comprises silicon.

8. The method of claim 1, further comprising using a pattern guide to assist in effecting a pattern of damage on the thin film.

9. The method of claim 8, wherein the pattern guide is placed adjacent the thin film before step (b).

10. The method of claim 9, wherein the pattern guide comprises an electrically conducting material.

11. The method of claim 10, wherein the pattern guide comprises a metal.

12. The method of claim 9, wherein the pattern guide is selected from the group consisting of an electric insulator formed with an opening for guiding the electron beam or arc, a magnetic or electrostatic deflection plate, a magnetic lens and an electrostatic lens.

13. The method of claim 8, wherein the pattern guide does not contact the thin film.

14. The method of claim 8, wherein the pattern guide comprises a pantograph.

15. The method of claim 1, further comprising placing a grounding plate adjacent an opposing side of the entrance side, the grounding plate electrically connected to a ground.

16. The method of claim 1, further comprising contacting the entrance side with an etching chemical subsequent to step (b).

17. The method of claim 1, further comprising coating the entrance side with a SERS-capable metal subsequent to step (b).

18. A method for providing a substrate that can conduct Surface-Enhanced Raman Spectroscopy (SERS) thereon, the method comprising the steps of:
(a) placing a substrate in between two electrodes that are each electrically connected to a plasma generator;
(b) activating the plasma generator to discharge a plasma-containing electron beam or arc upon the substrate, thereby removing portions of substrate from the entrance side by the beam or arc; and
(c) subsequently coating the entrance side with a SERS-capable metal.

19. The method of claim 18, further comprising, between steps (b) and (c), a step of contacting the entrance side with an etching chemical.

20. The method of claim 18, wherein the SERS-capable metal is selected from the group consisting of gold, silver, copper, platinum, titanium, chromium, and combinations thereof.

21. The method of claim 18 wherein the substrate comprises silicon.

22. A method for fabricating a microfluidic channel on a substrate coated with a thin film barrier, the method comprising the steps of:
(a) placing a substrate, coated with a thin film comprising a barrier on at least one of the substrate's surfaces, in between two electrodes that are each electrically connected to a plasma generator;
(b) activating the plasma generator to discharge a plasma-containing electron beam or arc upon the thin film, thereby removing portions of the thin film barrier in the form of a preliminary channel from the entrance side by the beam or arc; and
(c) subsequently contacting the entrance side with an etching chemical to deepen the preliminary channel into desired channel dimension.

23. The method of claim 22, further comprising a step of placing a pattern guide, comprising an electric insulator and formed with an opening, adjacent the thin film before step (b) to guide the electron beam or arc.

* * * * *